United States Patent [19]
Gilbert et al.

[11] Patent Number: 5,733,794
[45] Date of Patent: Mar. 31, 1998

[54] PROCESS FOR FORMING A SEMICONDUCTOR DEVICE WITH ESD PROTECTION

[75] Inventors: Percy Veryon Gilbert; Paul G. Y. Tsui; Shih-Wei Sun, all of Austin; Stephen G. Jamison, Buda, all of Tex.

[73] Assignee: Motorola, Inc., Schaumburg, Ill.

[21] Appl. No.: 384,177

[22] Filed: Feb. 6, 1995

[51] Int. Cl.[6] .................................................. H01L 21/265
[52] U.S. Cl. .............................. 437/45; 437/41; 437/979
[58] Field of Search ........................... 257/355, 356, 257/357, 358, 359, 360, 361, 362, 363; 437/29, 40 GS, 41 CS, 41 GS, 44, 45, 979

[56] References Cited

U.S. PATENT DOCUMENTS

| | | | |
|---|---|---|---|
| 4,142,926 | 3/1979 | Morgan | 437/45 |
| 4,382,826 | 5/1983 | Pfleiderer et al. | 437/45 |
| 4,402,761 | 9/1983 | Feist | 437/45 |
| 4,509,067 | 4/1985 | Minami et al. | 257/361 |
| 4,602,267 | 7/1986 | Shirato | 257/358 |
| 4,697,199 | 9/1987 | De Gaaff et al. | 257/361 |
| 4,868,136 | 9/1989 | Ravaglia | 437/38 |
| 4,987,465 | 1/1991 | Longcor et al. | 257/357 |
| 5,183,773 | 2/1993 | Miyata | 437/43 |
| 5,290,724 | 3/1994 | Leach | 437/51 |
| 5,371,395 | 12/1994 | Hawkins | 257/356 |
| 5,395,773 | 3/1995 | Ravindhran et al. | 437/41 CS |
| 5,486,716 | 1/1996 | Saito et al. | 257/360 |
| 5,545,575 | 8/1996 | Cheng et al. | 437/44 |

FOREIGN PATENT DOCUMENTS 402 296  12/1990  European Pat. Off. ...... H01L 29/743

OTHER PUBLICATIONS

Charvaka Duvvury; "ESD Reliability for Advanced CMOS Technologies;" International Electron Devices and Materials Symposium (1990); pp. 265-272.

Stanley Wolf, Ph.D.; "Silicon Processing for the VLSI Era vol. 2: Process Integration"; pp. 356-359; (1990).

Kume, et al.; "A Flash-Erase EEPROM Cell with an Asymmetric Source and Drain Structure;" IEDM 87; pp. 560-563.

Krakauer, et al.; "ESD Protection in a 3.3V Sub-Micron Silicided CMOS Technology;" EOS/ESD Symposium 92; pp. 250-257 (1992).

Kodama, et al.; "A Symmetrical Side Wall (SSW)-DSA Cell for a 64Mbit Flash Memory;" IEDM 91; pp. 303-306.

Duvvury, et al.; "Realiability Design of p+—Pocket Implant LDD Transistors"; IEDM 90; pp. 215-218.

*Primary Examiner*—Brian Dutton
*Attorney, Agent, or Firm*—George R. Meyer

[57] ABSTRACT

A semiconductor device with an electrostatic discharge (ESD) protection transistor is devised, wherein the ESD protection transistor has halo regions of an opposite conductivity type from the source and drain regions adjacent thereto. In one embodiment, the ESD protection transistor is a thick field oxide (TFO) transistor. In some cases, the halo regions may be provided with an ion implant step without the use of an extra mask. The halo regions permit the ESD protection transistor to have its breakdown voltage adjusted so that it turns on before the device it is protecting is affected by an ESD event. The use of halo regions avoids the increase in device area and adverse effects to the AC performance of the circuit being protected that are disadvantages of prior approaches.

20 Claims, 3 Drawing Sheets

PROCESS FOR FORMING A SEMICONDUCTOR DEVICE WITH ESD PROTECTION

FIELD OF THE INVENTION

The present invention relates to metal-oxide-semiconductor (MOS) devices, and in particular, to electrostatic discharge (ESD) protection structures for MOS devices.

BACKGROUND OF THE INVENTION

The primary function of an ESD protection transistor is to direct ESD current away from the circuit it is protecting. Such ESD protection transistors are commonly used on microprocessors, embedded microcontrollers, application-specific integrated circuits and other logic devices, primarily for protection of the input/output buffers. For example, shown in FIG. 1 is a semiconductor device 10 having an NMOS output buffer 12, e.g., connected to an output pad 14 via line 16, where a thick field dielectric transistor 18, which may be a thick field oxide (TFO) transistor, is connected to line 16 to protect the output buffer 12 from ESD pulses coming from output pad 14. TFO transistor 18 acts as a parasitic bipolar transistor, but it must turn on before an NMOS transistor of the output buffer 12 reaches its impact ionization breakdown voltage, $BV_{Dii}$. If the TFO transistor 18 is not designed to turn on first, then the output buffer will fail an ESD pulse or stress, at, for example, 1 kV. Typically, the level of ESD protection will vary as the fabrication process changes due to variations in the on-resistance characteristics of the output buffers. It will be appreciated that throughout the specification the ESD protection transistor being discussed may be employed between input pads and input buffers as well as at outputs, and for any other device requiring ESD protection.

A number of approaches have been used to improve ESD protection transistors. For example, the use of silicide-blocked source and drain regions has been used to enhance ESD strength but the ESD protection is still insufficient. Another common method to ensure that the ESD protection transistor turns on first is to increase the channel length of the output buffer transistors so that they are harder to turn on. However, this option results in an unacceptable increase in device area due to the simultaneous increase in device width that is necessary to maintain performance.

Another approach, shown in FIG. 2 is to add series resistance, $R_T$, 20 between the TFO ESD protection transistor 18 and the output buffer 12. The disadvantage with this attempted solution is that the amount of resistance needed to guarantee current flow through the TFO transistor 18 severely affects the AC performance of the output buffer circuit 12.

SUMMARY OF THE INVENTION

An advantage of the invention is that the breakdown voltage of the TFO transistor can be independently optimized. Further, the inventive features of the device can be provided without any additional masking steps to complicate the fabrication process. Additionally, the structures of the present invention can be scaled to smaller features as new technologies permit integrated circuits to be reduced further in size.

Other features and advantages of the present invention will be apparent from the accompanying drawings and from the detailed description that follows. In carrying out these and other objects of the invention, there is provided, in one form, a semiconductor device having a field-dielectric input protection transistor which has a source region having a first conductivity type, a drain region having the first conductivity type, a channel region lying between the source and drain regions, a halo region having a second conductivity type that is opposite the first conductivity type. The halo region lies adjacent to either the source region or the drain region, or a halo region lies adjacent to each of the source and drain region. The halo region or regions extend into at least a portion of the channel region. Further, the field-dielectric input protection transistor has a gate electrode and a gate dielectric layer at least 1000 angstroms thick.

BRIEF DESCRIPTION OF THE DRAWINGS

The present invention is illustrated by way of example and not limitation in the accompanying figures, in which like references indicate similar elements, and in which.

It will be appreciated that some of the figures are not necessarily to scale, so as to illustrate important features of the invention.

DETAILED DESCRIPTION OF INVENTION

Use of a halo region around the source region or the drain region or use of halo regions around the source and drain regions, of an ESD protection transistor helps optimize its breakdown voltage and permits customization or tuning of the ESD transistor without appreciable increased process complexity, performance degradation, or use of additional area. The ESD transistor may be a thick field oxide (TFO) transistor positioned to serve a protection function against ESD stresses. For the purposes of illustration, the ESD transistor will be discussed in terms of a TFO ESD transistor. The halo region helps the TFO ESD protection transistor turn on before the device it is protecting is affected. More specifically, and in a non-limiting example, if the TFO ESD protection transistor is an NMOS transistor, the provision for a p-type halo region around the $N^+$ drain region or a halo region around each of the $N^+$ source region and the $N^+$ drain region, lowers the avalanche breakdown voltage of the TFO protection transistor below the avalanche breakdown voltage or gate dielectric breakdown voltage of the output buffer or other device being protected. In another example, conductivity types may be reversed.

In one embodiment, placement of the halo implant does not require an additional masking sequence since it may be implanted or otherwise provided prior to forming the source and drain regions in the same areas. However, in another embodiment, a masking step may be required to prevent the halo implant from being implanted into the remainder of the active field or adjacent to the source and drain regions of the transistors similar to the ones used in the output buffer 12 of FIG. 1. Also, if it is desired to provide a halo region around only the drain region, an additional masking sequence would be needed. In one embodiment of the invention, the halo region surrounds and is adjacent to at least the drain region. In another embodiment, one halo region is adjacent to the source region and the another halo region is adjacent to the drain region.

Figure 1:
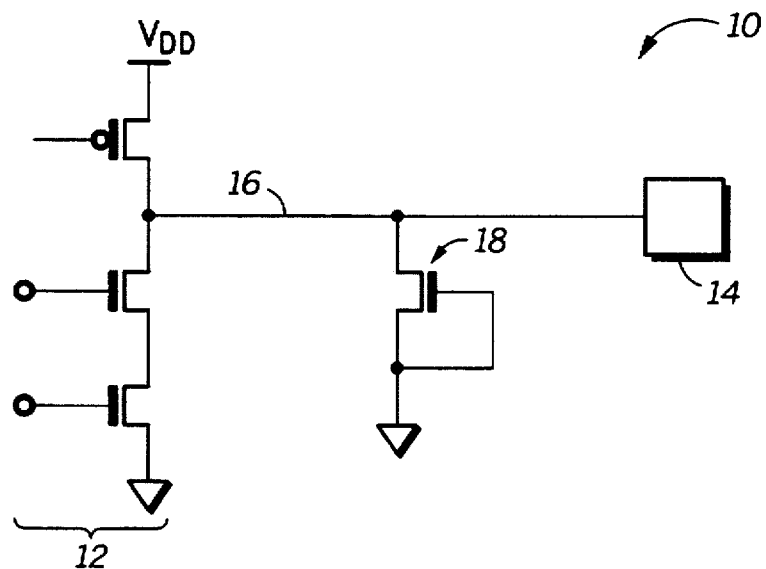
FIG. 1 is a conventional schematic circuit diagram of a semiconductor device having an ESD protection transistor between an output buffer and an output pad.
Figure 2:
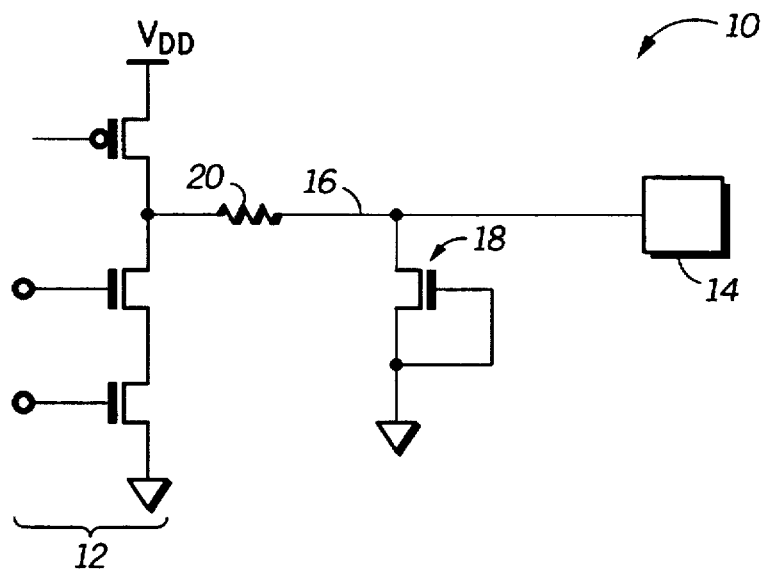
FIG. 2 is a conventional schematic circuit diagram of the semiconductor device having a resistor between the ESD protection transistor and the output buffer.

Further and importantly, the use of a halo implant can improve ESD protection transistor performance without the use of additional series resistance and with no increase in device area—two major drawbacks of prior proposed approaches. Also, this approach to improving ESD protection transistors can be used at various scales and would be suitable for continued employment as features continue to shrink, even below 0.5 μm. A process for forming a semiconductor device with the halo implant is described below. The schematic circuit diagram of the device is shown in FIG. 1. The description below focuses on the formation of the TFO ESD transistor.

Figure 3:
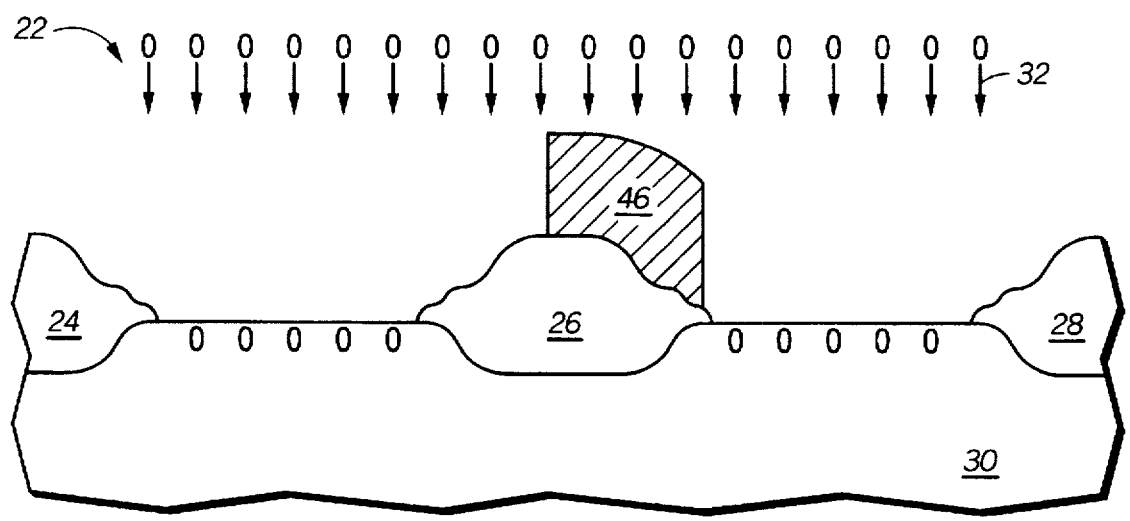
FIG. 3 is a cross-sectional view of a thick field oxide ESD protection transistor under construction after growth of the field oxide and formation of the gate electrode during an ion implantation for the halo regions.

Shown in FIG. 3 is a TFO ESD transistor 22 under construction after the thick field oxide regions 24, 26 and 28 have been grown on p-substrate 30 and gate electrode 46 has been formed by depositing and patterning a conductive layer, such as a metal or doped polysilicon. The thick field oxide region 26 will serve as the gate dielectric layer for the TFO ESD transistor 22 and has a thickness of at least 1000 Å. In many instances, the thick field oxide region 26 has a thickness in a range of 3000–6000 Å in a finished device. Compare this with a gate dielectric layer of traditional MOS transistors, such as the transistors within the output buffer 12, which is typically in a range of 50–500 Å thick. The thick field oxide region 26 is 10 times thicker than the gate dielectric layer for the transistors within the output buffer 12 and more typically is in a range of 20–50 times thicker.

A boron implant 32 or other suitable technique for selectively doping the regions between the field oxide regions 24, 26 and 28 is illustrated in FIG. 3. In non-limiting embodiment of the invention, the implant dose for the halo regions may range from about 8E12 to 2.5E13 ions/cm$^2$. The energy of the implant should be chosen such that the projected range lies at about the edge of the subsequently formed source and drain regions. If there is any doubt with respect to the depth of the source and drain regions, it is usually safer to have the projected range larger than the depth of the source and drain regions.

Figure 4:
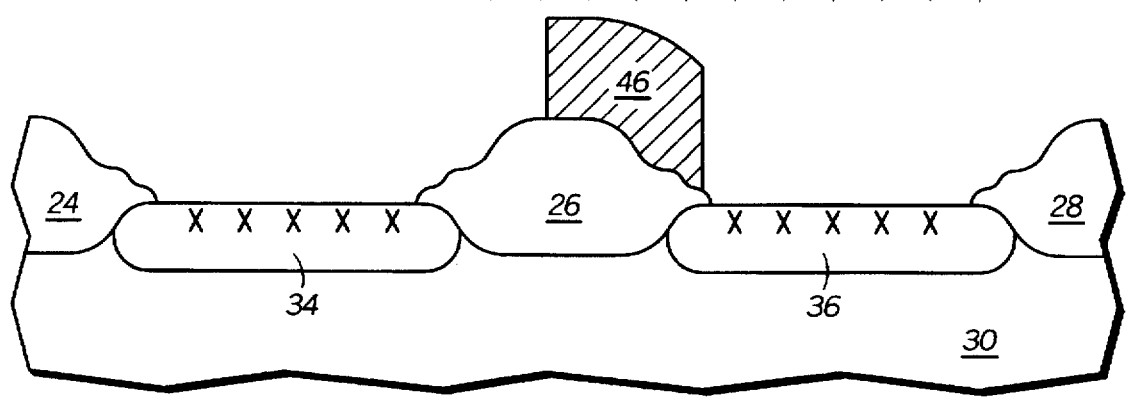
FIG. 4 is the cross-sectional of the FIG. 3 transistor after formation of the halo regions and during the ion implant to form the source and drain regions.
Figure 5:
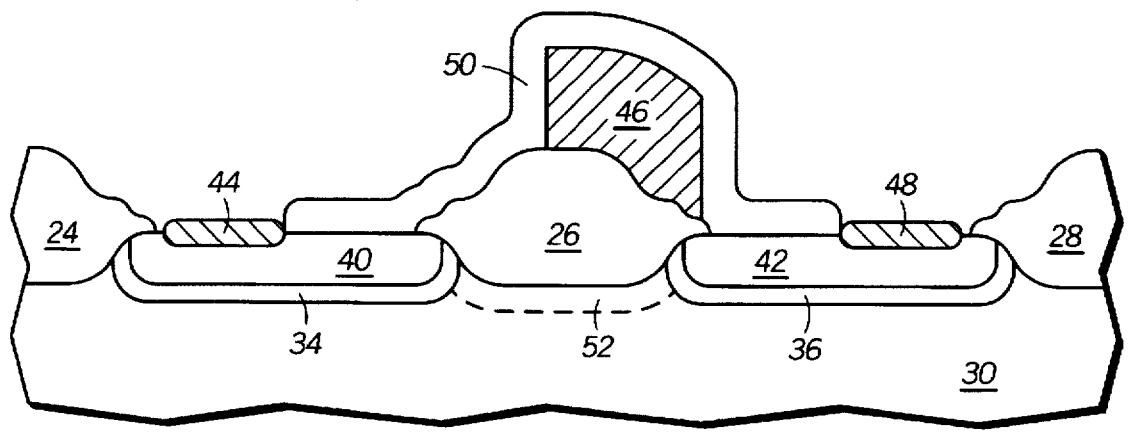
FIG. 5 is the cross-sectional of the FIG. 4 transistor nearing completion after placement and etching of a dielectric block and formation of metal silicide regions near the source and drain regions.

After the boron has been implanted, the transistor 22 can be subjected to a heat cycle to diffuse the boron sufficiently to produce the halo regions 34 and 36 as shown in FIG. 4. The heat cycle is optional. Halo regions 34 and 36 extend into at least a portion of what will be base region 52; see FIG. 5. In a finished device, the halo regions have an impurity concentration in a range of 5E17 to 2E18 atoms/cm$^3$. Also shown in FIG. 4 is the arsenic or phosphorus implant 38 to form the drain and source regions 40 and 42, respectively, as shown in FIG. 5. These source/drain N+junctions are generally abrupt and not graded. Each of the drain and source regions 40 and 42, respectively, has an impurity concentration of at least 1E19 atoms/cm$^3$.

FIG. 5 has a dielectric block 50, which covers gate electrode 46 and field oxide dielectric 26, and at least partially covers source region 42 and drain region 40. Dielectric block 50 may be any suitable dielectric, including, but not limited to silicon nitride and silicon oxide. Next, a drain silicide region 44 and a source silicide region 48 are formed by a conventional metal salicide (self-aligned silicide) process. In a non-limiting example, a titanium layer, e.g., is deposited over dielectric block 50 and field oxide 24 and 28, the substrate subjected to a high temperature to form titanium silicide at regions 44 and 48 where the titanium contacts the silicon within the source and drain regions 42 and 40, respectively, and the excess, unreacted titanium removed.

This dielectric block 50 provides balanced resistance to give better current spread at the source/drain contacts and to avoid "hot spots" at the corners where current might accumulate. Base region 52 exists when TFO ESD protection transistor 22 turns on during avalanche breakdown. During this avalanche breakdown, the transistor 22 acts as a parasitic bipolar transistor. Other planarization layers and protective layers (not shown) would be conventionally added. One or more of these steps forms an electrical connection between the gate electrode 46 and the source region 42, but is not shown in the figures.

The dose or concentration of the halo regions 34 and 36 are determined by the avalanche breakdown voltage desired for the TFO ESD transistor 22. The dose or concentration of the halo regions 34 and 36 is typically chosen such that the avalanche breakdown voltage for the TFO ESD transistor 22 should be lower than a breakdown voltage of the components that it is protecting.

Referring to FIG. 1, the transistors of the output buffer 12 are being protected by the TFO ESD transistor 22. The dose and concentration chosen for this example result in an avalanche breakdown voltage for the TFO ESD transistor 22 in a range of about 7–9 volts. If the avalanche breakdown voltage of transistors within the output buffer 12 is about 11 volts, the TFO ESD transistor 22 provides adequate protection.

Also, the avalanche breakdown voltage of the TFO ESD transistor 22 is less than the gate dielectric breakdown voltage for the transistors within the output buffer 12. If the transistors being protected by the TFO ESD transistor 22 have a gate dielectric breakdown voltage of 10 volts, the dose and concentration of the halo regions 34 and 36 are sufficient. The avalanche breakdown voltage of the TFO ESD transistor 22 is typically less than twice the potential of $V_{DD}$. If $V_{DD}$ is 5 volts, the dose or concentration of halo regions 34 and 36 are sufficient.

As the avalanche breakdown voltage of the components being protected, $V_{DD}$, and gate dielectric thicknesses become smaller, a lower avalanche breakdown voltage of the transistor 22 is needed. A lower avalanche breakdown voltage is obtained by increasing the dose and concentration of the halo regions 34 and 36. Clearly, specific numbers and ranges within these embodiments are meant to illustrate and not limit the present invention.

Figure 6:
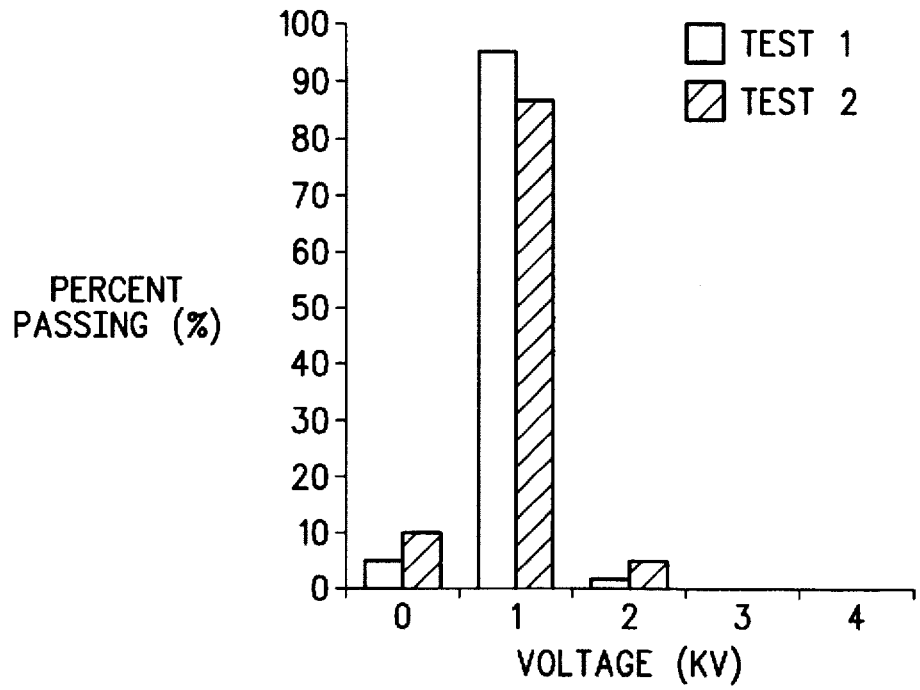
FIGS. 6 and 7 are graphs of the ESD pass voltage distribution for output pins without the halo region and with the halo region, respectively.
Figure 7:
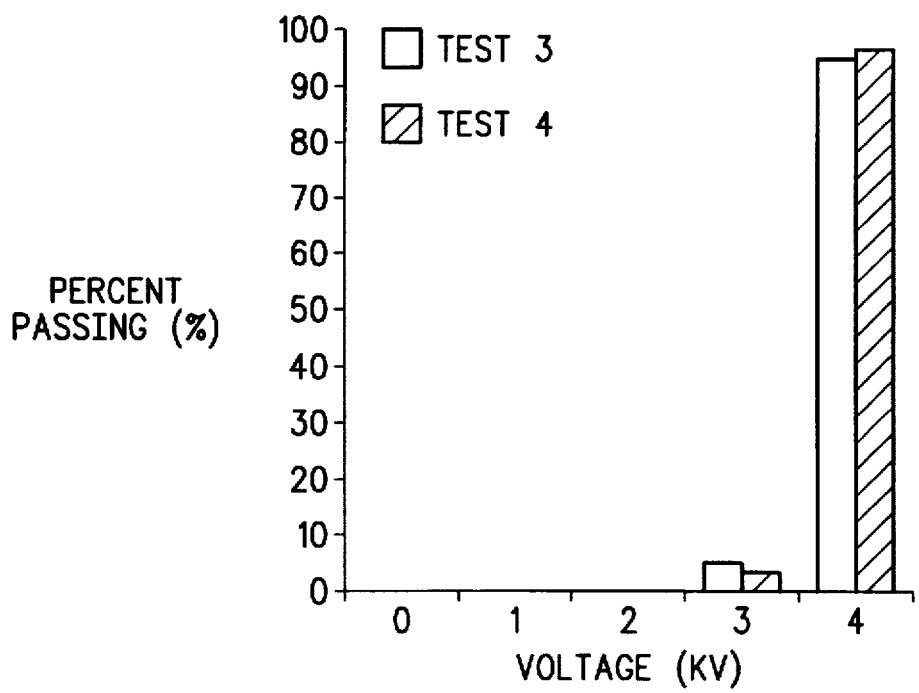

FIGS. 6 and 7 show the human body model (HBM) ESD pass voltage distribution for an output pin without the halo region and with it, respectively, as determined by experimental devices. FIG. 6 includes data on two different devices without a halo implant (TEST 1 and TEST 2), and FIG. 7 includes data for two different devices with a halo implant using boron with an energy of about 50 KeV and a dose of about 1.5E13 ions/cm$^2$ (TEST 3 and TEST 4).

In FIG. 6, the pass-rate voltage distribution for the pins coupled to ESD transistors having no halo implant indicates that no more than about 5% of the pins pass the 2 kV ESD pulse when no halo implant is used. However, in FIG. 7, the pass-rate voltage distribution for the output pins coupled to ESD transistor with the halo regions indicates at least about 95% of the pins pass the 4 kV ESD pulse. Semiconductor devices must be capable of withstanding at least a 2 kV ESD Thus the halo implant, for example, a p-type implant on an n-type TFO ESD protection transistor significantly improves the ESD robustness of devices so protected, as noted by the HBM ESD stress test results, presented above. The improved ESD performance may be directly attributed to the ability of the TFO ESD protection transistor custom-modified in accordance with this invention to allow the TFO ESD transistor to turn on before causing damage to the n-channel output buffer during an ESD event. The improved ESD performance may be achieved without the use of additional series resistance and with no increase in device area. In some cases, the p-type halo implant may require no additional photolithography masking steps. Formation of the halo regions may be easily integrated into existing fabrication process flows.

In the foregoing specification, the invention has been described with reference to specific embodiments thereof. However, it will be evident that various modifications and changes can be made thereto without departing from the scope of the invention as set forth in the appended claims. Accordingly, the specification and drawings are to be regarded in an illustrative rather than a restrictive sense.

The claimed invention includes:

1. A process for forming a semiconductor device having a field-dielectric electrostatic discharge (ESD) protection transistor comprising:

forming a gate dielectric layer at least 1000 angstroms thick over a substrate having a first conductivity type;

forming a gate electrode over at least a portion of the gate dielectric layer;

forming at least one halo region having the first conductivity type, wherein the at least one halo region lies adjacent to the gate dielectric layer; and forming a source region and a drain region having a second conductivity type that is opposite the first conductivity type and a base region having the first conductivity type and lying between the source and drain regions, wherein the at least one halo region extends into the base region, wherein:
      a $V_{DD}$ potential is associated with the semiconductor device;
      an avalanche breakdown voltage is associated with the ESD protection transistor; and
      the avalanche breakdown voltage is less than twice the $V_{DD}$ potential.

2. The process of claim 1, wherein the step of forming the at least one halo region forms a first halo region that lies adjacent to the drain region.

3. The process of claim 2, wherein the step of forming the at least one halo region forms a second halo region that lies adjacent to the source region.

4. The process of claim 1, further comprising a step of forming a component, wherein the step of forming the at least one halo region is performed such that an avalanche breakdown voltage of the ESD protection transistor is less than a breakdown voltage of the component.

5. The process of claim 1, wherein the step of forming the at least one halo region is performed by implanting ions of the first conductivity type to a dose in a range of 8E12 to 2.5E13 ions/cm².

6. The process of claim 1, wherein the gate dielectric layer has a thickness in a range of 3000–6000 angstroms thick.

7. The process of claim 1, wherein the step of forming the at least one halo region is performed such that the at least one halo region has a dopant concentration in a range of 5E17 to 2E18 atoms/cm³.

8. The process of claim 1, further comprising a step of forming first and second silicide regions, wherein the first silicide region overlies the source region and the second silicide region overlies the drain region.

9. The process of claim 8, wherein:

the step of forming the gate dielectric layer of the ESD protection transistor also forms a field isolation region, wherein;
      a first portion of the field isolation region lies adjacent to the source region and is spaced apart from the gate dielectric layer; and
      a second portion of the field isolation region lies adjacent to the drain region and is spaced apart from the gate dielectric layer; and the step of forming the first and second silicide regions is performed such that:
      the first silicide region lies adjacent to the source region and the first portion of the field isolation region but is spaced apart from the gate dielectric layer; and
      the second silicide region lies adjacent to the drain region and the second portion of the field isolation region but is spaced apart from the gate dielectric layer.

10. A process for forming a semiconductor device comprising:

forming an electrostatic discharge (ESD) protection transistor including:
      a source region having a first conductivity type;
      a drain region having the first conductivity type and coupled to a pad;
      a base region lying between the source and drain regions of the ESD protection transistor;
      at least one halo region having a second conductivity type that is opposite the first conductivity type, wherein the at least one halo region:
         lies adjacent to a region selected from a group consisting of the source region of the ESD protection transistor and the drain region of the ESD protection transistor; and
         extends into at least a portion of the base region;
      a gate electrode; and
      a gate dielectric layer; and
      wherein:
         a $V_{DD}$ potential is associated with the semiconductor device;
         an avalanche breakdown voltage is associated with the ESD protection transistor; and
         the avalanche breakdown voltage is less than twice the $V_{DD}$ potential; and forming a field-effect transistor (FET) including:
      a source region;
      a drain region coupled to the pad;
      a channel region lying between the source and drain regions of the FET;
      a gate electrode; and
      a gate dielectric layer.

11. The process of claim 10, wherein:

the gate dielectric layer of the ESD protection transistor has a first thickness and the gate dielectric layer of the field-effect transistor has a second thickness; and the first thickness is at least ten times thicker than first thickness.

12. The process of claim 10, wherein the step of forming the at least one halo region forms a first halo region that lies adjacent to the drain region of the ESD protection transistor.

13. The process of claim 12, wherein the step of forming the at least one halo region forms a second halo region that lies adjacent to the source region of the ESD protection transistor.

14. The process of claim 10, wherein the step of forming of the ESD protection transistor further comprises steps of:

covering the gate electrode, of the ESD protection transistor, the gate dielectric layer, of the ESD protection transistor, a portion of the source region, of the ESD protection transistor and a portion of the drain region of the ESD protection transistor with a dielectric block;

forming a first metal silicide region adjacent to the source region of the ESD protection transistor not covered by the dielectric block; and forming a second metal silicide region adjacent to the drain region of the ESD protection transistor not covered by the dielectric block.

15. The process of claim 14, wherein:

the step of forming the ESD protection transistor includes a step of forming the gate dielectric layer of the ESD protection transistor and a field isolation region, wherein;

a first portion of the field isolation region lies adjacent to the source region of the ESD protection transistor and is spaced apart from the gate dielectric layer of the ESD protection transistor; and a second portion of the field isolation region lies adjacent to the drain region of the ESD protection transistor and is spaced apart from the gate dielectric layer of the ESD protection transistor;

the step of forming the first metal silicide region is performed such that the first metal silicide region lies adjacent to the source region of the ESD protection transistor and the first portion of the field isolation region but is spaced apart from the pate dielectric layer of the ESD protection transistor; and the step of forming the second metal silicide region is performed such that the second metal silicide region lies adjacent to the drain region of the ESD protection transistor and the second portion of the field isolation region but is spaced apart from the gate dielectric layer of the ESD protection transistor.

16. The process of claim 10, wherein the step of forming the ESD protection transistor is performed such that the at least one halo region has a dopant concentration in a range of 5E17 to 2E18 atoms/cm$^3$.

17. The process of claim 10, wherein the step of forming the ESD protection transistor is performed such that the at least one halo region is formed by implanting ions of the second conductivity type to a dose in a range of 8E12 to 2.5E13 ions/cm$^2$.

18. The process of claim 10, the gate dielectric layer of the ESD protection transistor is thicker than the gate dielectric layer of the field-effect transistor.

19. The process of claim 18, wherein:

the gate dielectric layer of the ESD protection transistor has a thickness in a range of 3000–6000 angstroms; and the gate dielectric layer of the field-effect transistor has a thickness in a range of 50–500 angstroms.

20. The process of claim 10, wherein:

a component breakdown voltage is associated with the field-effect transistor;

an avalanche breakdown voltage is associated with the ESD protection transistor; and the avalanche breakdown voltage is less than the component breakdown voltage.

* * * * *